United States Patent
Yu (10) Patent No.: US 8,166,652 B2
(45) Date of Patent: May 1, 2012

(54) METHOD OF MAKING A CIRCUIT STRUCTURE OF A CIRCUIT BOARD

(75) Inventor: Cheng-Po Yu, Taoyuan County (TW)

(73) Assignee: Unimicron Technology Corp., Taoyuan (TW)

( * ) Notice: Subject to any disclaimer, the term of this patent is extended or adjusted under 35 U.S.C. 154(b) by 641 days.

(21) Appl. No.: 12/270,718

(22) Filed: Nov. 13, 2008

(65) Prior Publication Data
US 2010/0059256 A1  Mar. 11, 2010

(30) Foreign Application Priority Data
Sep. 5, 2008 (TW) ................ 97134205 A (51) Int. Cl.
H05K 3/10 (2006.01)
(52) U.S. Cl. ............. 29/852; 29/825; 29/830; 29/846
(58) Field of Classification Search .......... 29/825, 29/830, 846, 852
See application file for complete search history.

(56) References Cited

U.S. PATENT DOCUMENTS

| | | | |
|---|---|---|---|
| 5,486,234 A | 1/1996 | Contolini et al. | |
| 5,609,704 A * | 3/1997 | Hayama et al. | 156/89.16 |
| 6,051,448 A * | 4/2000 | Hayama et al. | 438/108 |
| 6,310,304 B1 * | 10/2001 | Hayama et al. | 174/264 |
| 6,374,733 B1 * | 4/2002 | Hayama et al. | 101/170 |
| 6,930,256 B1 | 8/2005 | Huemoeller et al. | |
| 7,080,448 B2 | 7/2006 | Wu et al. | |
| 7,402,220 B2 * | 7/2008 | Murosawa et al. | 156/89.12 |
| 7,913,382 B2 * | 3/2011 | Heitzinger | 29/846 |
| 2004/0164420 A1 | 8/2004 | Li et al. | |
| 2005/0057906 A1 * | 3/2005 | Nakatani et al. | 361/771 |
| 2006/0258053 A1 | 11/2006 | Lee et al. | |
| 2007/0114203 A1 | 5/2007 | Kang | |

FOREIGN PATENT DOCUMENTS

| | | |
|---|---|---|
| CN | 1968565 | 5/2007 |
| DE | 102006051762 | 6/2007 |
| JP | 55-070490 | 5/1980 |
| JP | 200-243899 | 9/2005 |
| JP | 2007-142403 | 6/2007 |
| KR | 10-2007-0052965 | 5/2007 |
| TW | I278263 | 4/2007 |

OTHER PUBLICATIONS

Chinese Examination Report of Taiwan Application No. 097134205, dated on Nov. 25, 2011.

* cited by examiner

Primary Examiner — Carl Arbes
(74) Attorney, Agent, or Firm — J.C. Patents (57) ABSTRACT

A circuit structure of a circuit board includes a dielectric layer, a number of first circuits, and a number of second circuits. The dielectric layer has a surface and an intaglio pattern. The first circuits are disposed on the surface of the dielectric layer. The second circuits are disposed in the intaglio pattern of the dielectric layer. Line widths of the second circuits are smaller than line widths of the first circuits, and a distance between every two of the adjacent second circuits is shorter than a distance between every two of the adjacent first circuits.

6 Claims, 7 Drawing Sheets

METHOD OF MAKING A CIRCUIT STRUCTURE OF A CIRCUIT BOARD

CROSS-REFERENCE TO RELATED APPLICATION

This application claims the priority benefit of Taiwan application serial no. 97134205, filed on Sep. 5, 2008. The entirety of the above-mentioned patent application is hereby incorporated by reference herein and made a part of specification.

BACKGROUND OF THE INVENTION

1. Field of the Invention

The present invention relates to a circuit structure of a circuit board and a process for manufacturing the same. More particularly, the present invention relates to a circuit structure of a circuit board in which embedded circuits and non-embedded circuits are together disposed in a circuit layer and a process for manufacturing the circuit structure of the circuit board.

2. Description of Related Art

According to current technologies, an embedded circuit board has been evolved from a common non-embedded circuit board. In particular, the common non-embedded circuit board is characterized in that circuits therein protrude from a surface of a dielectric layer. By contrast, circuits of the embedded circuit board are inlaid in the dielectric layer. Currently, a circuit structure of the circuit board is formed by performing a photolithography and etching process or a laser ablating process. Please refer to FIGS. 1A through 1E, FIGS. 2A through 2C, and following descriptions regarding a method of forming said circuit structure of the circuit board.

Figure 1A:
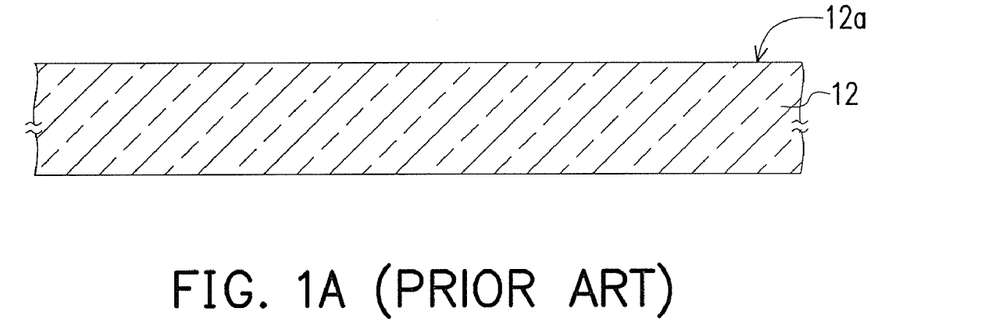
FIGS. 1A through 1E are schematic cross-sectional views illustrating a process for manufacturing a circuit structure of a conventional circuit board.
Figure 1B:
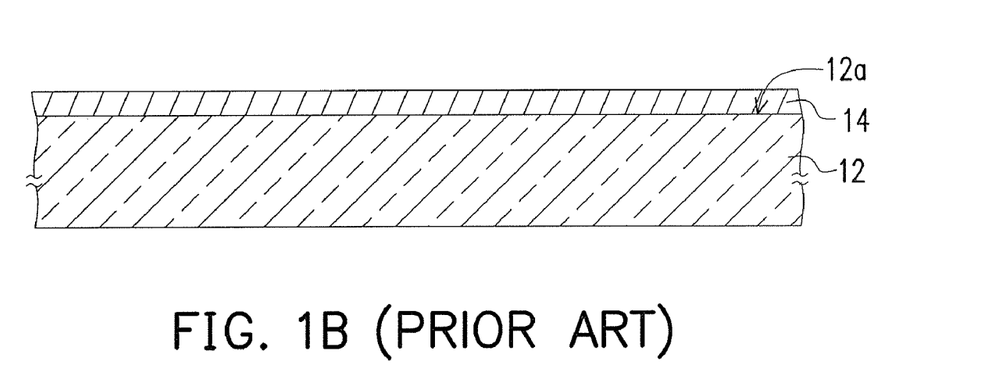
Figure 1C:
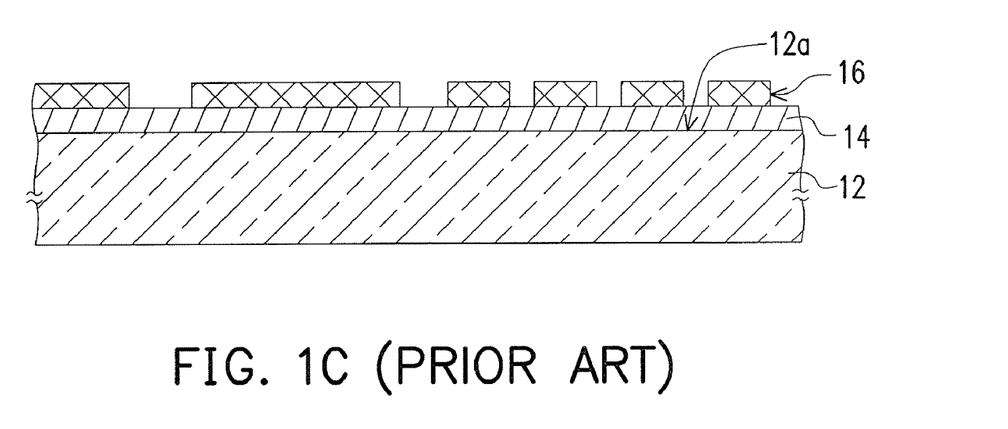
Figure 1D:
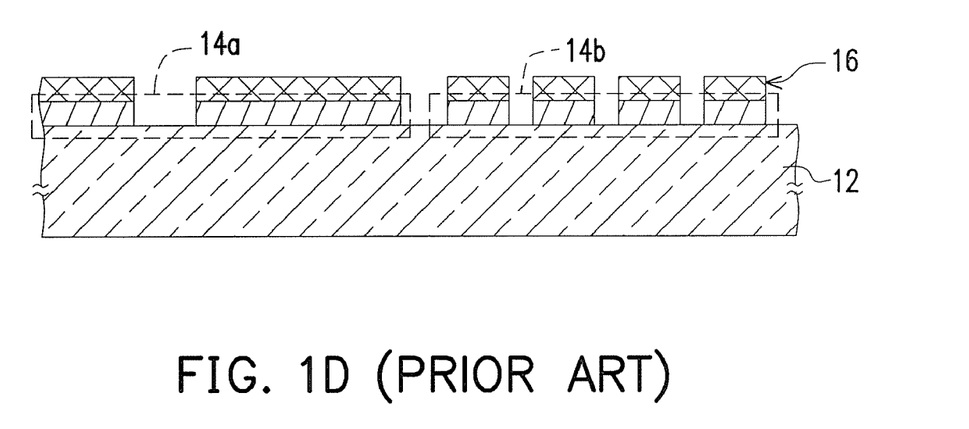
Figure 1E:
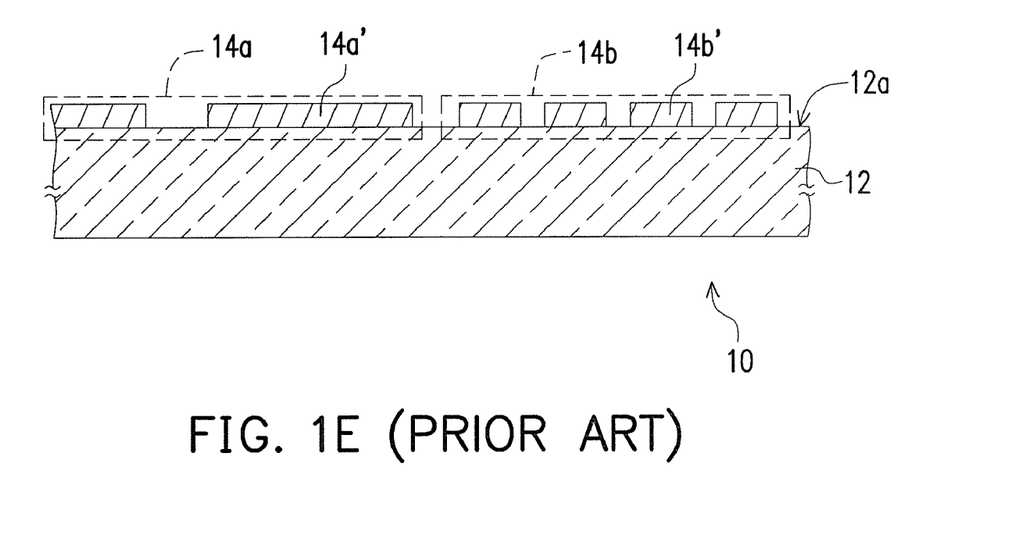

FIGS. 1A through 1E are schematic cross-sectional views illustrating a process for manufacturing a circuit structure of a conventional circuit board. As shown in FIG. 1A, in the process for manufacturing the circuit structure of the conventional circuit board, a dielectric layer 12 having a surface 12a is provided at first. Next, as indicated in FIG. 1B, a metal layer 14 is formed on the surface 12a of the dielectric layer 12. Referring to FIG. 1C, a patterned mask 16 is then formed on the metal layer 14. Thereafter, referring to FIGS. 1C and 1D, a portion of the metal layer 14 which is not covered by the patterned mask 16 is etched with use of the patterned mask 16 as an etching mask, so as to form a normal circuit pattern 14a and an ultra fine circuit pattern 14b. After that, the patterned mask 16 is removed to expose the normal circuit pattern 14a and the ultra fine circuit pattern 14b. A circuit structure of a conventional circuit board 10 is roughly formed so far.

In the circuit structure of the conventional circuit board 10, the photolithography and etching process is performed to simultaneously form the normal circuit pattern 14a and the ultra fine circuit pattern 14b in a circuit layer. Here, a line width of a circuit 14b' of the ultra fine circuit pattern 14b is smaller than a line width of a circuit 14a' of the normal circuit pattern 14a. Nonetheless, subject to manufacturing limitations of the conventional etching process by which the circuit 14b' of the ultra fine circuit pattern 14b is formed, an etching variability in the etching process with use of an etchant is unlikely to be precisely controlled, i.e., residual copper on the metal layer 14 and on the surface 12a of the dielectric layer 12 is not able to be well managed. Thereby, the line width of the circuit 14b' of the ultra fine circuit pattern 14b has a relatively large tolerance when the ultra fine circuit pattern 14b is fabricated by performing the conventional manufacturing process. In other words, the line width of the circuit 14b' of the ultra fine circuit pattern 14b cannot be accurately manipulated in the conventional etching process. As such, in the circuit structure of the conventional circuit board 10, the normal circuit pattern 14a and the ultra fine circuit pattern 14b cannot be formed on the surface 12a of the same dielectric layer 12 by implementing the conventional photolithography and etching process.

Figure 2A:
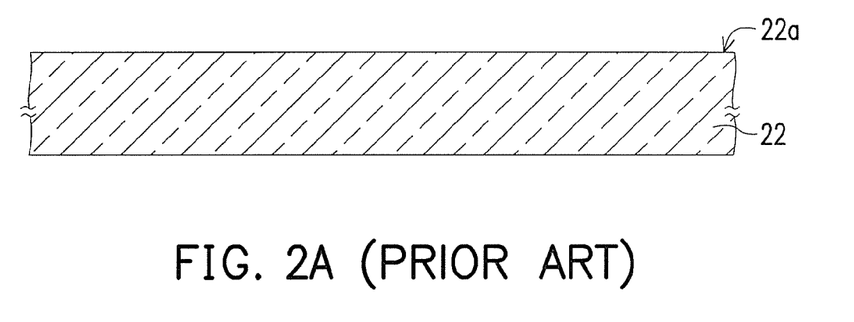
FIGS. 2A through 2C are schematic cross-sectional views illustrating a process for manufacturing a circuit structure of a conventional embedded circuit board.
Figure 2B:
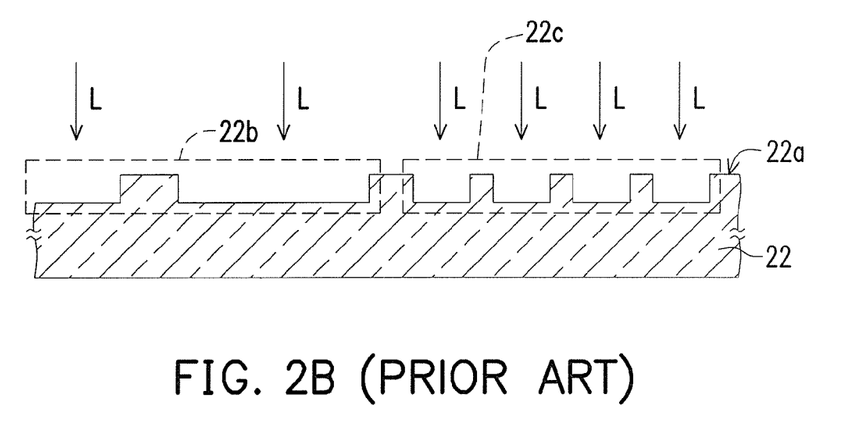
Figure 2C:
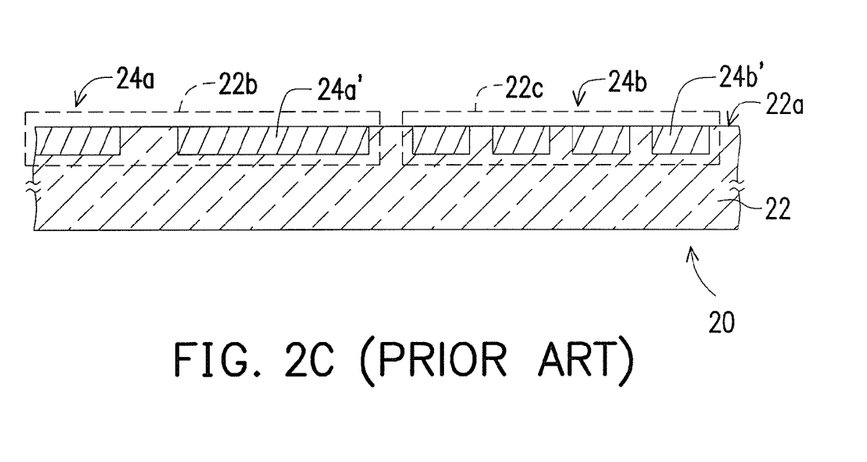

FIGS. 2A through 2C are schematic cross-sectional views illustrating a process for manufacturing a circuit structure of a conventional embedded circuit board. As shown in FIG. 2A, in the process for manufacturing the circuit structure of the conventional embedded circuit board, a dielectric layer 22 having a surface 22a is provided at first. Next, as indicated in FIG. 2B, the surface 22a of the dielectric layer 22 is irradiated by a laser beam L, so as to form a first intaglio pattern 22b and a second intaglio pattern 22c. Referring to FIG. 2C, a normal circuit pattern 24a and an ultra fine circuit pattern 24b are then formed in the first intaglio pattern 22b and the second intaglio pattern 22c, respectively. A circuit structure of a conventional embedded circuit board 20 is roughly formed so far.

In the circuit structure of the conventional embedded circuit board 20, the laser ablating process is performed to simultaneously form the normal circuit pattern 24a and the ultra fine circuit pattern 24b in a circuit layer. Here, a line width of a circuit 24a' of the normal circuit pattern 24a is greater than a line width of a circuit 24b' of the ultra fine circuit pattern 24b. That is to say, in order to allow the circuit 24a' of the normal circuit pattern 24a to have the required line width, the laser ablating process must be performed on a relatively large area on the dielectric layer 22 with use of the laser beam L for forming the first intaglio pattern 22b. Thereby, more laser energy and more time are required. In addition, given that the laser ablating process is performed on the dielectric layer 22 for a long time, flatness of a bottom surface of the first intaglio pattern 22b may not be uniform. Namely, the laser abating process is not suitable for manufacturing the normal circuit pattern 24a in the circuit structure of the conventional embedded circuit board 20 due to possibilities of consuming additional time and resulting in unstable circuit quality.

SUMMARY OF THE INVENTION

The present invention is directed to a circuit structure of a circuit board and a process for manufacturing the same, such that a circuit structure simultaneously satisfying that embedded circuits and non-embedded circuits are together disposed in a same circuit layer is provided.

In the present invention, a circuit structure of a circuit board including a dielectric layer, a plurality of first circuits, and a plurality of second circuits is provided. The dielectric layer has a surface and an intaglio pattern. The first circuits are disposed on the surface of the dielectric layer. The second circuits are disposed in the intaglio pattern of the dielectric layer. Line widths of the second circuits are smaller than line widths of the first circuits, and a distance between every two of the adjacent second circuits is shorter than a distance between every two of the adjacent first circuits.

According to an embodiment of the present invention, the circuit structure of the circuit board further includes a patterned deposition layer. The patterned deposition layer is disposed between the first circuits and the surface of the dielectric layer and between the second circuits and an inner wall of the intaglio pattern.

According to an embodiment of the present invention, a material of the patterned deposition layer includes copper, tin, aluminum, nickel, zinc, or gold.

According to an embodiment of the present invention, a material of the first circuits includes copper or aluminum.

According to an embodiment of the present invention, a material of the second circuits includes copper or aluminum.

According to an embodiment of the present invention, the second circuits and the surface of the dielectric layer are substantially aligned.

The present invention further provides a process for manufacturing a circuit structure of a circuit board. A dielectric layer is provided at first. The dielectric layer has a surface. Next, a portion of the surface of the dielectric layer is irradiated by a laser beam, so as to form an intaglio pattern. A metal layer is then formed on the dielectric layer and covers the surface of the dielectric layer and the intaglio pattern. Thereafter, a photolithography and etching process is carried out to form a plurality of first circuits and a plurality of second circuits. The first circuits are disposed on the surface of the dielectric layer, and the second circuits are disposed in the intaglio pattern of the dielectric layer. Line widths of the second circuits are smaller than line width of the first circuits, and a distance between every two of the adjacent second circuits is shorter than a distance between every two of the adjacent first circuits.

According to an embodiment of the present invention, before the metal layer is formed on the dielectric layer, the process for manufacturing the circuit structure of the circuit board further includes forming a deposition layer on the surface of the dielectric layer. Here, the deposition layer covers an inner wall of the intaglio pattern. After that, an electroplating process is performed to form the metal layer on the deposition layer.

According to an embodiment of the present invention, a method of forming the deposition layer includes performing a sputtering process, an inkjet printing process or a chemical deposition plating.

According to an embodiment of the present invention, a material of the deposition layer includes copper, tin, aluminum, nickel, zinc, or gold.

According to an embodiment of the present invention, the step of performing the photolithography and etching process includes forming a patterned mask on the metal layer. Next, with use of the patterned mask as an etching mask, a portion of the metal layer is removed by performing a first etching process, and the deposition layer located below the portion of the metal layer is removed by performing a second etching process, so as to form the first circuits and the second circuits. Here, the portion of the metal layer is not covered by the patterned mask. The patterned mask is then removed.

According to an embodiment of the present invention, the first etching process and the second etching process are substantially different from each other.

According to an embodiment of the present invention, a material of the metal layer includes copper or aluminum.

According to an embodiment of the present invention, the second circuits and the surface of the dielectric layer are substantially aligned.

In light of the foregoing, according to the present invention, the intaglio pattern is formed in the dielectric layer by implementing a laser ablating process, and the photolithography and etching process is then carried out to form the first circuits (e.g. normal circuits) protruding from the surface of the dielectric layer and the second circuits (e.g. ultra fine circuits) located in the intaglio pattern. In the pertinent art, the normal circuits and the ultra fine circuits are simultaneously formed through applying the same manufacturing technique, i.e., the laser ablating process or the photolithography and etching process. By contrast, the circuit structure of the circuit board and the process for manufacturing the same in the present invention will give a successful application for one of the ordinary skill in the art.

In order to make the above and other features and advantages of the present invention more comprehensible, several embodiments accompanied with figures are described in detail below.

BRIEF DESCRIPTION OF THE DRAWINGS

The accompanying drawings constituting a part of this specification are incorporated herein to provide a further understanding of the invention. Here, the drawings illustrate embodiments of the invention and, together with the description, serve to explain the principles of the invention.

DESCRIPTION OF EMBODIMENTS

Figure 3:
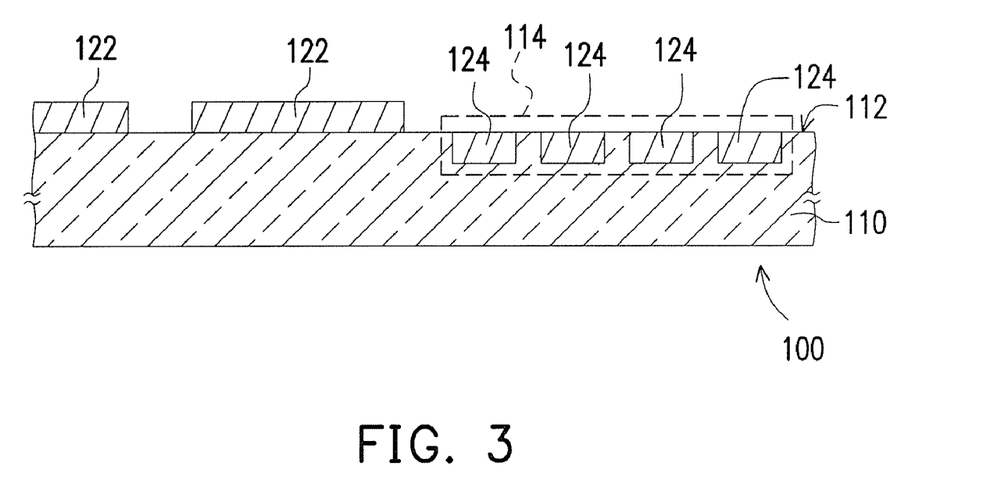
FIG. 3 is a schematic cross-sectional view illustrating a circuit structure of a circuit board according to an embodiment of the present invention.

FIG. 3 is a schematic cross-sectional view illustrating a circuit structure of a circuit board according to an embodiment of the present invention. Referring to FIG. 3, in the present embodiment, a circuit structure of a circuit board 100 includes a dielectric layer 110, a plurality of first circuits 122, and a plurality of second circuits 124. In FIG. 3, only two of the first circuits 122 and four of the second circuits 124 are schematically depicted. The dielectric layer 110 has a surface 112 and an intaglio pattern 114. The first circuits 122 are disposed on the surface 112 of the dielectric layer 110. The second circuits 124 are disposed in the intaglio pattern 114 of the dielectric layer 110. Line widths of the second circuits 124 are smaller than line widths of the first circuits 122. Specifically, in the present embodiment, the first circuits 122 and the second circuits 124 are in the same circuit layer, and the first circuits 122 and the second circuits 124 can be made of the same material including copper or aluminum, for example.

Note that the circuit structure of the circuit board 100 can have a single circuit layer or multiple circuit layers. That is to say, the circuit board can be a single layer circuit board, a double layer circuit board, or a multi-layer circuit board. In the present embodiment, the exemplificative circuit structure of the circuit board 100 merely has the single circuit layer as illustrated in FIG. 3.

To be more specific, the first circuits 122 are disposed on the surface 112 of the dielectric layer 110. Namely, the first circuits 122 protrude from the surface 112 of the dielectric layer 110 and are normal non-embedded circuits. Additionally, the second circuits 124 are disposed in the intaglio pattern 114 of the dielectric layer 110 and are substantially aligned with the surface 112 of the dielectric layer 110. In other words, the second circuits 124 in the circuit structure of the circuit board 100 are embedded circuits as a matter of fact.

Besides, in the present embodiment, the line widths of the second circuits 124 are smaller than the line widths of the first circuits 122. Relatively speaking, the first circuits 122 can be deemed as normal circuits, and the second circuits 124 can be considered as ultra fine circuits. For instance, in the present embodiment, the line widths of the second circuits 124 are smaller than 50 μm, and the line widths of the second circuits 124 are smaller than the line widths of the first circuits 122. In other words, the line widths of the first circuits 122 are equal to or greater than 50 μm. On the other hand, a distance between every two of the adjacent second circuits 124 is shorter than a distance between every two of the adjacent first circuits 122. In particular, the distance between every two of the adjacent first circuits 122 is usually the same as each of the line widths of each of the first circuits 122. That is to say, when each of the line widths of each of the first circuits 122 is 50 μm, the distance between every two of the adjacent first circuits 122 is 50 μm as well. Likewise, the distance between every two of the adjacent second circuits 124 is usually the same as each of the line widths of each of the second circuits 124. It shall be mentioned that the distance between every two of the adjacent circuits can also be different from each of the line widths of each of the circuits in other embodiments, given that the circuits are required to have specific impedance property for signal transmission.

In brief, the circuit structure of the circuit board 100 in the present embodiment has the first circuits 122 protruding from the surface 112 of the dielectric layer 110 and the second circuits 124 embedded in the intaglio pattern 114 of the dielectric layer 110. The first circuits 122 and the second circuits 124 are in the same circuit layer. The line widths of the second circuits 124 are smaller than the line widths of the first circuits 122, and the distance between every two of the adjacent second circuits 124 is shorter than the distance between every two of the adjacent first circuits 122. Namely, the circuit structure of the circuit board 100 has the embedded ultra fine circuits and the non-embedded normal circuits in the same circuit layer according to the present invention.

Up to here, only the circuit structure of the circuit board 100 is discussed, while a process for manufacturing the circuit structure of the circuit board 100 of the present invention has not yet been described. An embodiment is accordingly provided below for elaborating the process for manufacturing a circuit structure of a circuit board 100A as indicated in FIGS. 4A through 4G. In the present embodiment, the circuit board single layer circuit board.

Figure 4A:
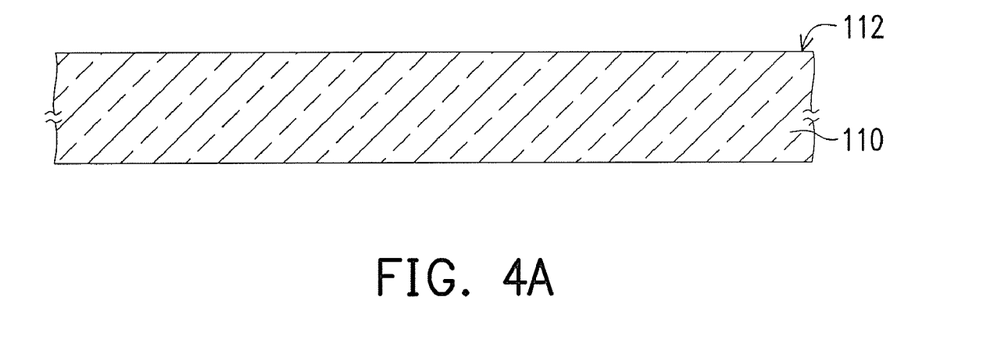
FIGS. 4A through 4G are schematic cross-sectional views illustrating a process for manufacturing a circuit structure of a circuit board according to an embodiment of the present invention.

FIGS. 4A through 4G are schematic cross-sectional views illustrating a process for manufacturing the circuit structure of the circuit board according to an embodiment of the present invention. As shown in FIG. 4A, in the process for manufacturing the circuit structure of the circuit board 100A according to the present embodiment, a dielectric layer 110 having a surface 112 is provided at first.

Figure 4B:
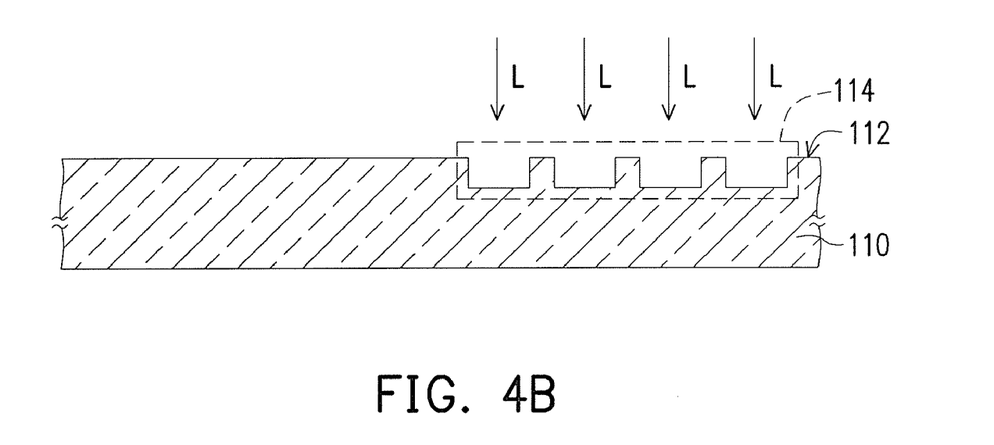

Next, as indicated in FIG. 4B, a portion of the surface 112 of the dielectric layer 110 is irradiated by a laser beam L, so as to form an intaglio pattern 114. The laser beam L can be supplied by a carbon dioxide laser light source, an ultraviolet laser light source, or any other appropriate laser machines. Note that the intaglio pattern 114 of the present embodiment is formed by means of the laser beam L, and therefore the intaglio pattern 114 can be formed at any position on the surface 112 of the dielectric layer 110. The position and the arrangement of the intaglio pattern 114 as shown in FIG. 4B are merely exemplificative and should not be construed as limitations to the present invention.

Figure 4C:
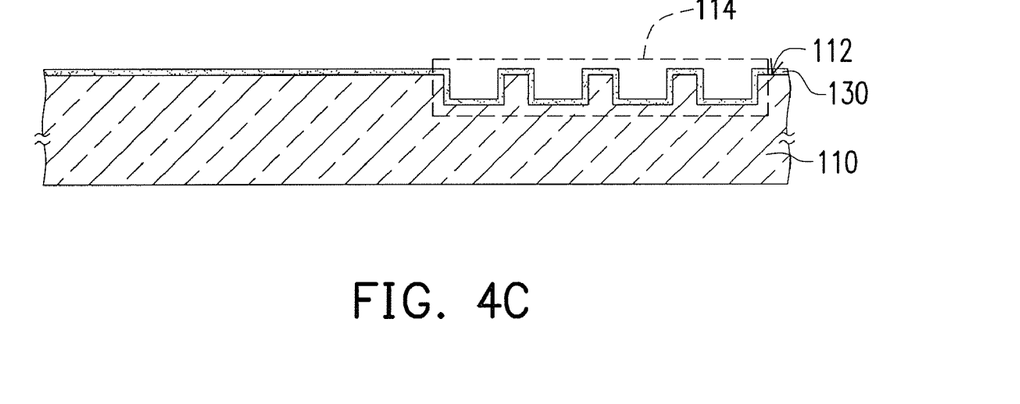

Referring to FIG. 4C, a deposition layer 130 is then formed on the surface 112 of the dielectric layer 110, and the deposition layer 130 covers an inner wall of the intaglio pattern 114. In the present embodiment, the deposition layer 130 is formed by performing a sputtering process, an inkjet printing process or a chemical deposition plating. Besides, the deposition layer 130 is formed by depositing a chemical copper layer for subsequently performing an electroplating process, for example. Here, a material of the deposition layer 130 is, for example, tin, aluminum, nickel, zinc, or gold. Certainly, in other embodiments that are not depicted in the drawings, the deposition layer 130 can be made of a material different from the material of the first circuits 122 and the second circuits 124 (as shown in FIG. 4E) to be formed later.

Figure 4D:
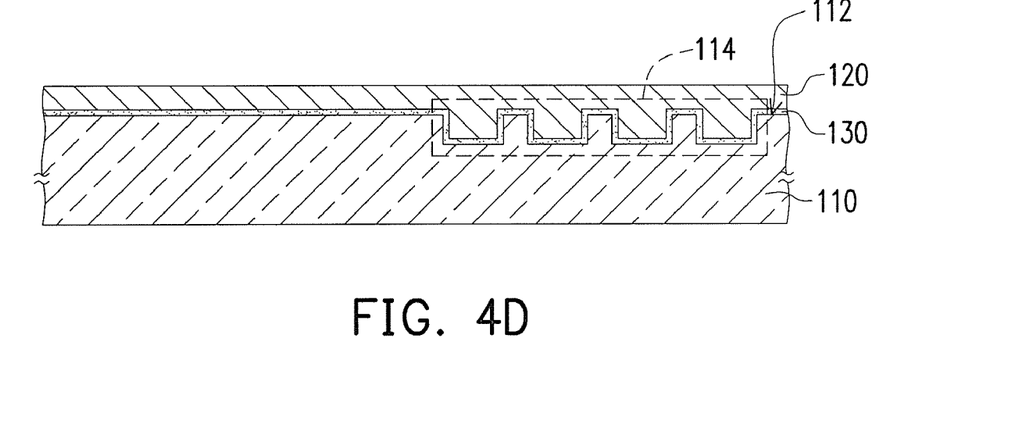

Thereafter, referring to FIG. 4D, a metal layer 120 is formed on the deposition layer 130 by performing the electroplating process. The metal layer 120 covers the surface 112 of the dielectric layer 110 and the intaglio pattern 114. In the present embodiment, a material of the metal layer 120 includes copper. It is certain that the material of the metal layer 120 can include aluminum according to other embodiments that are not depicted in the drawings.

Figure 4E:
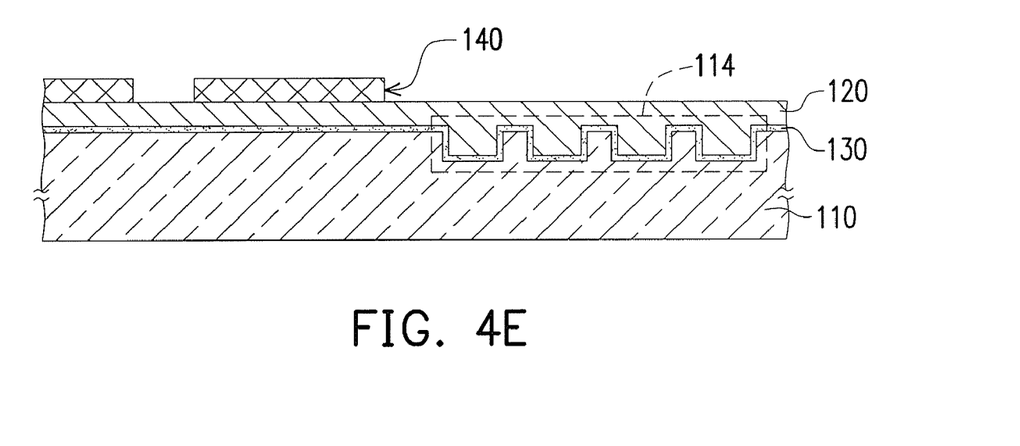
Figure 4F:
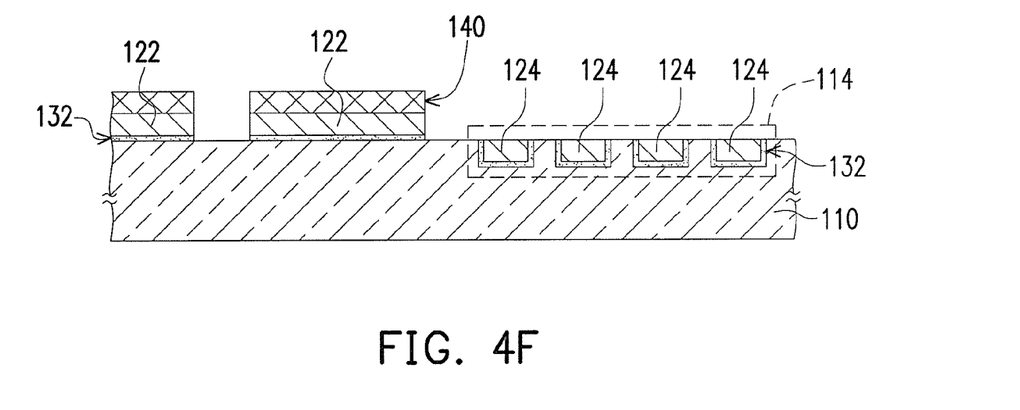

Next, referring to FIG. 4E, a photolithography and etching process is implemented. An embodiment of forming the first circuits 122 and the second circuits 124 is discussed hereinafter, while the method of forming the first circuits 122 and the second circuits 124 is not limited in the present invention. First, a patterned mask 140 is formed on the metal layer 120. Next, referring to FIGS. 4E and 4F, with use of the patterned mask 140 as an etching mask, a portion of the metal layer 120 is removed by performing a first etching process, and the deposition layer 130 located below the portion of the metal layer 120 is removed by performing a second etching process, so as to form the first circuits 122, the second circuits 124, and a patterned deposition layer 132. Here, the portion of the metal layer 120 is not covered by the patterned mask 140. In FIG. 4F, only two of the first circuits 122 and four of the second circuits 124 are schematically depicted. Here, line widths of the second circuits 124 are smaller than line widths of the first circuits 122, and a distance between every two of the adjacent second circuits 124 is shorter than a distance between every two of the adjacent first circuits 122.

In detail, the first circuits 122 are formed between the surface 112 of the dielectric layer 110 and the patterned mask 140, and the second circuits 124 are formed in the intaglio pattern 114 of the dielectric layer 110. Besides, the second circuits 124 are substantially aligned with the surface 112 of the dielectric layer 110. That is to say, the first circuits 122 protruding from the surface 112 of the dielectric layer 110 can be deemed as normal non-embedded circuits, while the second circuits 124 inlaid in the intaglio pattern 114 of the dielectric layer 110 can be considered as embedded circuits. In addition, the patterned deposition layer 132 is disposed between the first circuits 122 and the surface 112 of the dielectric layer 110 and between the second circuits 124 and an inner wall of the intaglio pattern 114 of the dielectric layer 110.

Specifically, the line widths of the first circuits 122 are relatively large. For instance, the line widths of the first circuits 122 are equal to or greater than 50 μm, and therefore the photolithography and etching process suitable for fabricating circuits with relative large line widths is implemented for forming the first circuits 122 on the surface 112 of the dielectric layer 110. Since the line widths of the first circuits 122 are relatively large, the first circuits 122 are not subject to manufacturing limitations of the photolithography and etching process.

Furthermore, the second circuits 124 of the present embodiment are formed in the intaglio pattern 114 of the dielectric layer 110, and the intaglio pattern 114 is formed by laser ablating the dielectric layer 110 with use of a laser beam L (as shown in FIG. 4B). In other words, a width of the intaglio pattern 114 laser ablated by using the laser beam L is equal to each of the line widths of each of the second circuits 124. Hence, it is possible to ensure the required width of the intaglio pattern 114 by managing the energy and the laser-ablating speed of the laser beam L, such that the line widths of the second circuits 124 can be precisely controlled. Additionally, the line widths of the second circuits 124 are relatively small, for example, smaller than 50 μm, and therefore the dielectric layer 110 is laser ablated by the laser beam L (as shown in FIG. 4B) for a short period of time. As such, the manufacturing time of the intaglio pattern 114 can be reduced.

In other embodiments that are not depicted in the drawings, after the first etching process is performed to remove the portion of the metal layer 120 that is not covered by the patterned mask 140, the exposed deposition layer 130 underlying the metal layer 120 can serve as a patterning and etching indicator for confirming an etching status of the metal layer 120, given that the deposition layer 130 and the metal layer 120 are made of different materials. In the present embodiment, it is certain that the first etching process is substantially different from the second etching process. Here, etchant and etching conditions are taken into consideration during the first etching process and the second etching process, respectively. Namely, the metal layer 120 and the deposition layer 130 are removed by performing different etching processes.

Figure 4G:
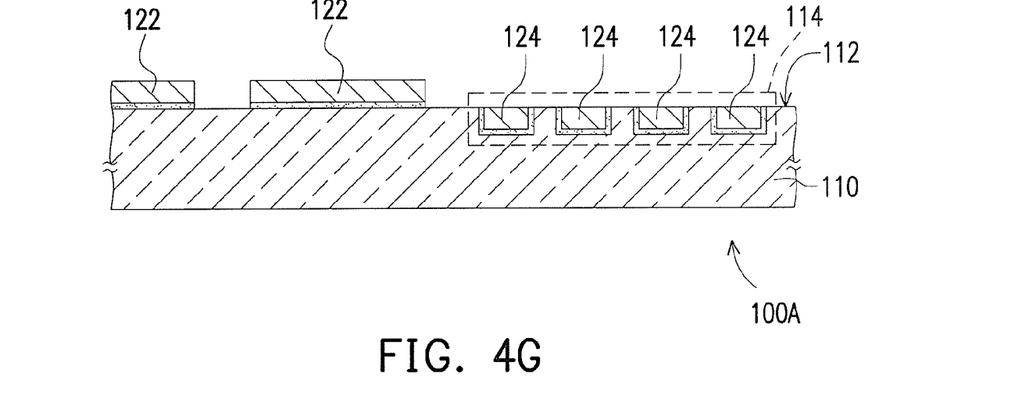

Afterwards, referring to FIG. 4G, the patterned mask 140 is removed to expose the first circuits 122. So far, the first circuits 122 are completely formed on the surface 112 of the dielectric layer 110, and the second circuits 124 are completely formed in the intaglio pattern 114 of the dielectric layer 110. In other words, the circuit structure of the circuit board 100A is roughly formed.

In a word, the circuit structure of the circuit board 100A in the present embodiment is formed by using the laser beam L and performing a subtractive process. First, the laser beam L is employed to form the intaglio pattern 114 on the surface 112 of the dielectric layer 110 in the circuit structure of the circuit board 100A. The metal layer 120 is then electroplated, and the portion of the metal layer 120 that is not covered by the patterned mask 140 is etched by using the patterned mask 140 as the etching mask. Next, the patterned mask 140 is removed to form the second circuits 124 embedded in the dielectric layer 110 and the first circuits 122 protruding from the dielectric layer 110. Furthermore, through utilizing different manufacturing techniques for forming the first circuits 122 and the second circuits 124 in the present embodiment, the manufacturing time can be reduced in an effective manner during the process for manufacturing the circuit structure of the circuit board 100A, and both the quality and the production yield can be improved.

To sum up, the laser ablating process and the photolithography and etching process are applied in the present invention for forming the first circuits protruding from the surface of the dielectric layer and the second circuits embedded in the intaglio pattern of the dielectric layer. The first circuits and the second circuits are formed in the same circuit layer. The line widths of the second circuits are smaller than the line widths of the first circuits, and the distance between every two of the adjacent second circuits is shorter than the distance between every two of the adjacent first circuits. As such, the circuit structure of the circuit board can be equipped with the embedded ultra fine circuits and the non-embedded normal circuits in the same circuit layer according to the present invention. In the pertinent art, the normal circuits and the ultra fine circuits are simultaneously formed through applying the same manufacturing technique. By contrast, the circuit structure of the circuit board and the process for manufacturing the same in the present invention will give a successful application for one of the ordinary skill in the art.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A process for manufacturing a circuit structure of a circuit board, the process comprising:
   providing a dielectric layer having a surface;
   irradiating a portion of the surface of the dielectric layer with use of a laser beam, so as to form an intaglio pattern;
   forming a deposition layer on the surface of the dielectric layer, the deposition layer covering an inner wall of the intaglio pattern, wherein a method of forming the deposition layer comprises performing a sputtering process, an inkjet printing process or a chemical deposition plating;
   performing an electroplating process to form a metal layer on the deposition layer, wherein the metal layer covers the deposition layer; and
   performing a photolithography and etching process to form a plurality of first circuits and a plurality of second circuits, wherein the first circuits are disposed on the surface of the dielectric layer, the second circuits are disposed in the intaglio pattern of the dielectric layer, line widths of the second circuits are smaller than line width of the first circuits, and a distance between every two of the adjacent second circuits is shorter than a distance between every two of the adjacent first circuits.

2. The process for manufacturing the circuit structure of the circuit board as claimed in claim 1, wherein a material of the deposition layer comprises copper, tin, aluminum, nickel, zinc, or gold.

3. The process for manufacturing the circuit structure of the circuit board as claimed in claim 1, wherein the step of performing the photolithography and etching process comprises:
   forming a patterned mask on the metal layer;
   removing a portion of the metal layer by performing a first etching process and removing the deposition layer located below the portion of the metal layer by performing a second etching process with use of the patterned mask as an etching mask, so as to form the first circuits and the second circuits, the portion of the metal layer being uncovered by the patterned mask; and
   removing the patterned mask.

4. The process for manufacturing the circuit structure of the circuit board as claimed in claim 3, wherein the first etching process and the second etching process are substantially different from each other.

5. The process for manufacturing the circuit structure of the circuit board as claimed in claim 1, wherein a material of the metal layer comprises copper or aluminum.

6. The process for manufacturing the circuit structure of the circuit board as claimed in claim 1, wherein the second circuits and the surface of the dielectric layer are substantially aligned.

* * * * *